United States Patent [19]
Aldrich et al.

[11] Patent Number: 5,399,460
[45] Date of Patent: Mar. 21, 1995

[54] NEGATIVE PHOTORESISTS CONTAINING AMINOACRYLATE SALTS

[75] Inventors: Paul E. Aldrich; Philip Manos; Allan E. Nader, all of Wilmington, Del.

[73] Assignee: E. I. Du Pont de Nemours and Company, Wilmington, Del.

[21] Appl. No.: 803,311

[22] Filed: Dec. 4, 1991

[51] Int. Cl.⁶ .............................. G03C 1/73
[52] U.S. Cl. .................. 430/287; 430/281; 430/283; 522/149; 522/164
[58] Field of Search .......... 430/281, 283, 287; 522/137, 138, 149; 525/426

[56] References Cited

U.S. PATENT DOCUMENTS

| | | | |
|---|---|---|---|
| 2,893,868 | 7/1959 | Barney | 430/281 |
| 4,243,743 | 1/1981 | Hiramoto et al. | 430/281 |
| 4,608,333 | 8/1986 | Ohbayashi et al. | 430/281 |
| 5,019,482 | 5/1991 | Ai et al. | 430/283 |

FOREIGN PATENT DOCUMENTS

| | | |
|---|---|---|
| 391752 | 9/1989 | Japan . |
| 3-206454 | 9/1991 | Japan . |
| 3-206455 | 9/1991 | Japan . |

*Primary Examiner*—Marion E. McCamish
*Assistant Examiner*—Laura Weiner

[57] ABSTRACT

Negative photoresists, and electronic devices comprising dielectric polyimide films resulting from such photoresists. The Photoresists comprise polyamic acids, which have been neutralized with tertiary amines containing double bonds of the acrylic family, the amines including acrylamines, alkylacrylamines such as for example methacrylamines, ethacrylamines, and the like. Also methods of making such amines in high purity.

2 Claims, No Drawings

NEGATIVE PHOTORESISTS CONTAINING AMINOACRYLATE SALTS

FIELD OF THE INVENTION

This invention relates to negative photoresists, and electronic devices comprising dielectric polyimide films resulting from such photoresists. The photoresists of this invention comprise polyamic acids, which have been neutralized with tertiary amines containing double bonds of the acrylic family, the amines including acrylamines, alkylacrylamines such as for example methacrylamines, ethacrylamines, and the like. It also relates to methods of making such amines in high purity.

BACKGROUND OF THE INVENTION

Photopolymerizable polymeric compositions used to form relief structures on electrical devices are well known. Also, photosensitive polyamic acid derivatives, which produce thermally stable polyimide films upon cure, have been widely employed for this purpose. Directly patternable photosensitive polyimides simplify relief structure construction in semiconductor manufacture by eliminating conventional photoresists and their attendant processing steps. Negative working photoactive functions can be incorporated into polyimide precursors as polyamic acid esters. These photoactive functions include acrylate, methacrylate, allyl, vinyl, and related double bonds containing structures which can be photopolymerized.

Application of the described photosensitive polyimide precursors or photoresists involves coating a solution of these materials on to a substrate, such as a silicon wafer, and drying to form a film. The film is then exposed to radiation through a masking template and photopolymerized. Unexposed regions, which remain soluble, are removed with a developer solution, leaving behind a relief structure. Thermal curing of the relief structure converts the photopolymerized material into a polyimide coating with pattern definition.

Whereas most photosensitive polyamic acid ester resins are developable after exposure by a range of techniques, including spray, puddle and immersion development, the photosensitive polyamic acid salts most widely employed, process best with polyamic acids which are readily soluble in the common process solvents, such as for example N-methyl-2-pyrrolidone, dimethyacetamide, dimethyl formamide, and dimethyl sulfoxide, and frequently require prolonged immersion or puddle development methods with the commonly employed developers, which usually are composed of various N-methyl-2-pyrolidone, alcohol, water mixtures. Polyamic acid dialkylamine acrylate and methacrylate salts in particular, generally require slow immersion or batch type development for optimum pattern resolution, and therefore are mainly limited to readily soluble polyamic acid systems, in order to be commercially processable. Slow development rates make continuous spray equipment impractical for many polyamic acid salt formulations. Slow development also hinders use of less soluble, rigid polyamic acids, such as that prepared from biphenyl dianhydride and para-phenylene diamine, as their photosensitive dialkylamine acrylate, methacrylate, etc salts. Thus, the desirable features of rigid polyimide structures, such as low thermal expansion, low stress, and excellent mechanical properties, are not readily attainable as a processable photosensitive amine salt precursor. Therefore, it is desirable to prepare photosensitive salts of the rigid, less soluble polyamic acids which can be conveniently processed to well resolved patterned polyimide coatings on different substrates, and especially electronic devices.

Synthesis of the required N-substituted aminoacrylates or methacrylates may be accomplished in by (1) transesterification of aminoalcohols with the corresponding acrylic and methacrylic esters, such as methylacrylate or methylmethacrylate, (2) catalyzed esterification of acrylic and methacrylic acids with aminoalcohols, which requires long reaction intervals, and (3) reaction of aminoalcohols with expensive methacrylic acid chlorides. Acid catalyzed esterification is generally ineffective due to neutralization with the aminoalcohol.

Purification of the ester products has been conducted in the past by distillation under reduced pressure. This procedure, however, subjects the easily polymerizable aminoacrylate, methacrylate, etc., esters to heat for considerable periods during distillation. High boiling products, such as the di- and trimethacrylate esters of aminoalcohols, herein referred to as amino(meth)acrylates, or more generally as amines containing double bonds of the acrylic family, which require greater distillation temperatures, can undergo significant yield loss, due to unwanted polymerization and thermal degradation, even in the presence of selected polymerization inhibitors. Cases where reaction byproducts are removed by extraction and final isolation by solvent removal alone, cannot assure product purity.

Therefore a synthesis and isolation scheme which can produce acrylate and methacrylate esters of mono- and polyhydric aminoalcohols in high yield and purity is also warranted.

SUMMARY OF THE INVENTION

The present invention is directed to the synthesis and application of negative, polyamic acid based, photoresists used for forming relief polyimide structures on electrical devices such as for example semiconductors, capacitors or printed circuits. The compositions prepared according to the present invention can be used to prepare coatings which are readily patterned by photopolymerization using actinic radiation. Formulations prepared with the particular amino(meth)acrylate monomers of this invention yield well resolved negative images which can be smoothly developed employing a range of polyamic acid salts, including polymers which have been heretofore impractical to develop. Thermal curing provides a durable polyimide patterned coating with mechanical, electrical and chemical properties useful in electrical device manufacture. More particularly, this invention pertains to a negative photoresist comprising:

an aprotic solvent;
a photosensitizing ingredient;
a reaction product of a polyamic acid and
a tertiary amine at least partially neutralizing the polyamic acid, the amine having a formula selected from the group consisting of

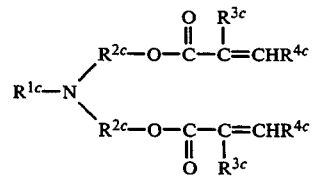

-continued

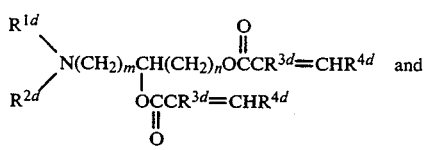

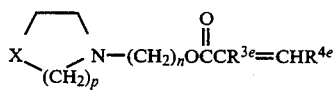

$R^{1c}$, $R^{1d}$, and $R^{2d}$ are independently alkyl with 1 to 6 carbon atoms, or cyclo-alkyl with 3 to 6 carbon atoms;

$R^{2c}$ is alkyl with 2 to 12 carbon atoms or cyclo-alkyl with 3 to 6 carbon atoms;

$R^{3c}$, $R^{3d}$, and $R^{3e}$ are independently H or alkyl with 1 or 2 carbon atoms;

$R^{4c}$, $R^{4d}$, and $R^{4e}$ are independently H or aryl;

X is oxygen or sulfur;

m and n are independently integers 1 to 6; and p is an integer 1 or 2;

the amine being in an effective amount to introduce 10 to 200 ethylenic bonds per 100 carboxylic groups of the polyamic acid;

with the requirement that the photoresist has in a film of a thickness in a range from 13 to 17 micrometers:

a Development Rate of at least 0.10 micrometer per second;

a Thickness Retention of at least 70% at an exposure level of 480 mJ/cm²; and a Minimum Feature Size of at most 20 micrometers.

This invention also pertains to an electronic device comprising:

an electronic component selected from the group consisting of conductor, semiconductor, and insulator; and a film deposited thereon, the film comprising a polyimide, which polyimide has been formed by a polyamic and precursor comprising:

an aprotic solvent;

a photosensitizing ingredient;

a reaction product of a polyamic acid and a tertiary amine at least partially neutralizing the polyamic acid, the amine having a formula selected from the group consisting of

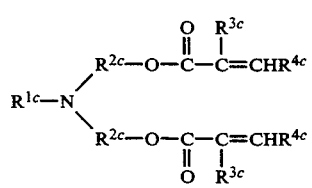

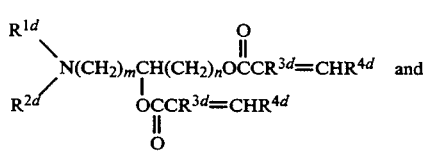

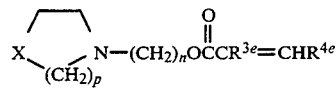

where $R^{1c}$, $R^{1d}$, and $R^{2d}$ are independently alkyl with 1 to 6 carbon atoms, or cyclo-alkyl with 3 to 6 carbon atoms;

$R^{2c}$ is alkyl with 2 to 12 carbon atoms or cyclo-alkyl with 3 to 6 carbon atoms;

$R^{3c}$, $R^{3d}$, and $R^{3e}$ are independently H or alkyl with 1 or 2 carbon atoms;

$R^{4c}$, $R^{4d}$, and $R^{4e}$ are independently H or aryl;

X is oxygen or sulfur;

m and n are independently integers 1 to 6; and p is an integer 1 or 2;

the amine being in an effective amount to introduce 10 to 200 ethylenic bonds per 100 carboxylic groups of the polyamic acid;

with the requirement that the photoresist has in a film of a thickness in a range from 13 to 17 micrometers:

a Development Rate of at least 0.10 micrometer per second;

a Retention of at least 70% at an exposure level of 480 mJ/cm²; and a Minimum Feature Size of at most 20 micrometers.

Preferably, in the inventions described above, the tertiary amine is selected from the group consisting of:

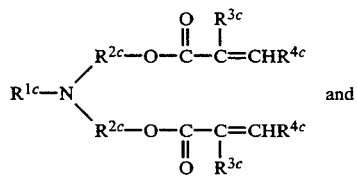

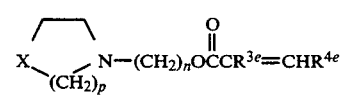

Even more preferably, the tertiary amine is selected from the group consisting of N-methyldiethanolamine dimethacrylate and 2-N-morpholinoethylmethacrylate Finally, this invention relates to a method of making an aminoacrylate ester comprising the steps of:

(a) dissolving an aminoalcohol in a solvent along with an acid of the acrylic family in an amount of 100–300 carboxyl group equivalents per 100 equivalents of hydroxyl groups, the acid containing a polymerization inhibitor;

(b) adding to the solution of step (b) a strong acid catalyst and stabilizer in molar excess of the aminoalcohol employed;

(c) effecting an esterification reaction by heat, and removing the water of esterification;

(d) neutralizing with a basic compound, washing, and drying;

(e) purifying by passing the solution of step (d) through a basic alumina column; and (f) removing the solvent.

DETAILED DESCRIPTION OF THE INVENTION

Aminoalcohol (Meth)acrylate Ester Synthesis

This invention utilizes the direct esterification of aminoalcohols (A) with acids of the acrylic family, such as for example acrylic, methacrylic, ethacrylic, and the like, as shown esterified in formula (B).

   (A)

$R^{1a}$ is $CH_2(CH_2)_nOH$,
$R^{2a}$, $R^{3a}$ are independently alkyl, c-alkyl, aryl, $CH_2(CH_2)_nOH$,
n is an integer 1-11

   (B)

$R^{1b}$ is $CH_2(CH_2)_nOR^{4b}$,
$R^{2b}$, $R^{3b}$ are independently alkyl, c-alkyl, aryl, $CH_2(CH_2)_nOR^{4b}$,
$R^{4b}$ is $COCR^{5b}$=$CHR^{6b}$,
$R^{5b}$ is H, alkyl $C_1$-$C_2$,
$R^{6b}$ is H, aryl
n is an integer 1-11.

The aminoalcohol is dissolved (15–50 wt %) in an aromatic solvent such as toluene or p-xylene, along with the acid of the acrylic family at 100–300 mol % of theory, and a polymerization inhibitor such as for example phenothiazine, p-methoxyphenol, or 2,6-di-t-butyl-4-methylphenol at 0.1–1.0 wt % methacrylic acid content. A sufficient amount of a catalyst and/or stabilizer, such as for example methanesulfonic acid is added (110–300 mol % aminoalcohol) to catalyze esterification and stabilize the product as an ammonium salt during reaction. Methanesulfonic or similar strong organic acids maintain the salt in solution. Heating the reaction to reflux produces the water of esterification, which may be removed azeotropically. Esterifcation rates are greater in p-xylene which co-distills with water at a higher temperature. Generally reaction is complete in approximately 4 hours (1 mol scale). After cooling, the product is neutralized, isolated in the organic phase, washed and dried. According to this invention, after removal of the drying agent, the product containing solution is purified by passage through a basic alumina column. Solvent removal under reduced pressure (1 torr), below 80° C., gives the corresponding ester in high yield and purity. No significant loss of product is observed. High boiling products such as triethanolamine trimethacrylate are isolated in high yield using this procedure. For example, the mono-, di- and trimethacrylate esters of aminoalcohols successfully prepared with this procedure are listed in Table 1. The aminomethacrylate esters that can be prepared by this procedure are defined by formula (B) but are not intended to be limited to such compounds. Considerably lower product yields and purities are received when the conventional distillation techniques are used for purifying the ester.

The structural effects of these amines having double bonds of the acrylic family, otherwise also referred to as aminoacrylates in this discussion, on polyamic acid salt preparation and processing provide the basis for the advances described herein.

Polyamic Acid Synthesis

Polyamic acid preparation and conversion to polyimides is performed by general procedures well known in the art and described in references such as Polyimides, D. Wilson, H. D. Stenzenberger and P. M. Hergenrother ed., Blackie & Sons, London, 1990, pp. 1–35; Polyimides: Thermally Stable Polymers, M. I. Bessanov, et al., 2nd edn., Plenum, New York (1987), pp. 1–95.

Solutions of diamines such as para-phenylene diamine, prepared in N-methylpyrrolidone, or other aprotic solvents listed below, are reacted with dianhydrides, such as 3,3',4,4'-biphenyl tetracarboxylic dianhydride, at 1.0–0.50 stoichiometric ratios, affording 10–30 wt % polyamic acid solutions after suitable reaction. The polyamic acids produced range in weight average molecular weight from 10,000–350,000, as determined by gel permeation chromatography versus a polystyrene reference. The reaction masses are pressure filtered through 0.1–10 micron filters before isolation.

Diamines which are suitable for use in the present invention include, but are not limited to bis(4-aminophenyl)ether, 4,4'-diamino-3,3'-dimethylbiphenyl, 4,4'-diamino-3,3'-dimethoxybiphenyl, 4,4'-bis(4-aminophenoxy)biphenyl, 4,4'-diaminodiphenylsulfone, 3,3'-diaminodiphenylsulfone, bis[4-(4-aminophenoxy)phenyl]sulfone, bis[4-(3-aminophenoxy)phenyl]sulfone, bis[4-(2-aminophenoxy)phenyl]sulfone, 1,4-bis (4-aminophenoxy)benzene, 4,4'-diamino-2,2'-dichloro-5,5'-dimethoxybiphenyl, 4,4'-diamino-2,2',5,5'-tetrachlorobiphenyl, 9,10-bis(4-aminophenyl)anthracene, o-tolidine sulfone, 1,3-bis(4-aminophenoxy)benzene, 1,3-bis(3-aminophenoxy)benzene, 1,4-bis(4-aminophenyl)benzene, [4-(4-aminophenoxy)phenyl]ether, bis(4-aminophenyl)methane, bis(4-amino-3-ethylphenyl)methane, bis(4-amino-3-methylphenyl)methane, bis(4-amino-3-chlorophenyl)methane, bis(4-aminophenyl)sulfide, bis(3-aminophenyl)ether, 3,4'-diaminodiphenyl ether, 4,4'-diaminooctafluorobiphenyl, 1,3-diaminobenzene, 2,2-bis[4-(4-aminophenoxy)phenyl]propane, 2,2-bis[4-(4-aminophenoxy)phenyl]hexafluoropropane, 2,2-bis (4-aminophenyl)propane, 2,2-bis(4-aminophenyl) hexafluoropropane, 2,2-bis(4-amino-3-hydroxyphenyl)propane, 2,2-bis(4-amino-3-hydroxyphenyl)hexafluoropropane, 9,9-bis(4-aminophenyl)-10-hydroanthracene, diaminoanthraquinones (e.g., 1,5-diamino-9,10-anthraquinone and 2,6-diaminoanthraquinone), 4,4'-diamino- 3,3'-dichlorobiphenyl, 4,4'-diamino-3,3'-dihydroxybiphenyl, 4,4'-diaminobiphenyl, 9,9-bis (4-aminophenyl) fluorene, bis(3-amino-4-methylphenyl)sulfone, 2- (4-aminobiphenyl)-2-[3-(4-aminophenoxy)phenyl]propane, Bisaniline M, Bisaniline P, bis(4-amino-2,6-methylphenyl)methane, 2,4-diamino-1-isopropylbenzene, 1,4-diamino-2,5-dichlorobenzene, 1,4-diamino-2,6-dichlorobenzene, 1,4-diamino-2,5-dimethylbenzene, 1,4-diamino-2-chlorobenzene, 1,3-diamino-4-chlorobenzene, 1,4-diamino-5-chloro-2-methylbenzene, 6-aceto-2,4-diamino-1,3,5-triazine, 1,4-diamino-2,3,5,6-tetramethylbenzene, 1,3-diamino-2,4,6-trimethylbenzene, bis(3-aminopropyl)tetramethyldisiloxane, 2,7-diaminofluorene, 2,5-diaminopyridine, 1,4-diaminobenzene, 1,2-bis(4-aminophenyl)ethane, 4,4'-diaminobenzanilide, 4-aminophenyl 4-aminobenzoate, 1,5-diaminonaphthalene, 2,4-diaminotoluene, 1,3-diamino-5-trifluoromethylbenzene, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, 1,4-bis(4-amino-2-trifluoromethylphenoxy) benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy) diphenyl sulfone, 4,4'-bis(3-amino-3-trifluoromethylphenoxy)diphenyl sulfone, 2,2-bis[ 4-(4-amino-3-trifluoromethylphenoxy)phenyl]hexafluoropropane, 4,4'-diamino-3,3',5,5'-tetramethylbiphenyl, 4,4'-diamino-2,2'-bis(trifluoromethyl)biphenyl, 4,4'-diamino-2,2'-dimethylbiphenyl, 4,4'-diamino-3,3'-dimethylhexafluorobiphenyl, 4,4'''-diaminoquaterphenyl, 1,3-diamino-5-tert-butylbenzene, 1,4-bis(3-aminophenoxy)benzene, bis[4-(3-aminophenyl)phenyl]ether, 4,4'-diamino-2,2'-dichlorobiphenyl, 3,3'-diamino-4,4'-dihydroxybiphenyl, and mixtures thereof.

Examples of suitable dianhydrides include, but are not limited to, 2,2-bis(3,4-dicarboxyphenyl)hexafluoropropane dianhydride, pyromellitic anhydride, 1,4,5,8-naphthalenetetracarboxylic dianhydride, 2,3,6,7-naphthalenetetracarboxylic dianhydride, 3,3',4,4'-biphenyltetracarboxylic dianydride, 1,2,5,6-naphthalenetetracarboxylic dianhydride, 2,2',3,3'-biphenyltetracarboxylic dianhydride, 3,3'4,4'-benzophenonetetracarboxylic dianhydride, 2,2-bis(3,4-dicarboxyphenyl)propane dianhydride, bis(3,4-dicarboxyphenyl)sulfone dianhydride, 3,4,9,10-perylenetetracarboxylic dianhydride, 1,1-bis(2,3-dicarboxyphenyl)ethane dianhydride, 1,1-bis(3,4-dicarboxyphenyl) ethane dianhdride, bis(2,3-dicarboxyphenyl) methane dianhydride, bis(3,4-dicarboxyphenyl)methane dianhydride, oxydiphthalic dianhydride, 9-trifluoromethyl-9-phenyl-2,3,6,7-xanthenetetra-carboxylic dianhydride, 9,9-bis(trifluoromethyl)xanthenetetra-carboxylic dianhydride, 12,14-(R)2-12,14-(R$_f$)2-12H,14H-5,7-dioxa-2,3,9,10-pentacenetetracarboxylic acid dianhydride (wherein R is selected from the group consisting of aryl, substituted aryl, and perfluoroalkyl, and R$_f$ is perfluoroalkyl), and mixtures thereof.

Suitable solvents for carrying out the polymerization reaction include, but are not limited to, aprotic or polar organic solvents, such as sulfoxide type solvents including dimethylsulfoxide, diethylsulfoxide, and the like, formamide type solvents, such as N,N-dimethylformamide, N,N-diethylformamide; acetamide type solvents, including N,N-dimethylacetamide, N,N- diethylacetamide; pyrrolidone type solvents, including N-methyl-2-pyrrolidone, N-cyclohexyl-2-pyrrolidone, 1,3-dimethyl-2-imidazolidinone, N-vinyl-2-pyrrolidone; ether solvents such as ethylene glycol dimethyl ether and diethylene glycol dimethyl ether; phenolic solvents, including phenol, o-, m-, and p-cresol, xylenol, halogenated phenol, catechol; hexamethylphosphoramide; and a number of lactones including γ-butyrolactones. These solvents may be used alone or as a mixture. Partial use of aromatic hydrocarbons such as xylene and toluene, is also possible, and sometimes desirable, when, for example, removal of water as an azeotrope is desired.

Photosensitive Component Formulation

Polyamic acid solutions prepared in an aprotic solvent as previously outlined, when admixed with suitable photo-polymerization initiators, photosensitizers, hydrogen donors, oxygen scavengers and stabilizers, provide formulations which upon addition of aminoalcohol acrylates, methacrylates, and the like, otherwise referred to as amines containing double bonds of the acrylic family, affords a photo-sensitive formulation for coating as a photoresist, which may remain on the device or removed if so desired.

Typical photopolymerization initiators effective with the formulations described herein include those disclosed by Goff U.S. Pat. No. 4,414,312, and references cited therein, which are hereby incorporated by reference. These include 2,4,5-triphenyl imidazolyl dimers having an ortho substituent on the 2 phenyl ring, such as 2-o-chlorophenyl-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(o-ethoxyphenyl)-4,5-diphenylimidazolyl dimer, and mixtures thereof. Particularly preferred are bis(2-o-chlorophenyl-4,5-diphenylimidazolyl) and bis[2-o-chlorophenyl-4,5-di-(m-methoxyphenyl) imidazolyl] since these compounds are stable and are effective polymerization initiators. The initiator may constitute 0.1-10 wt % of the total formulation.

Photosensitizers employed to increase formulation sensitivity include aromatic ketones also described in U.S. Pat. No. 4,414,312 and references cited therein, which are hereby incorporated by reference, such as benzophenone, 4,4'-bis(dimethylamino)benzophenone, 4,4'-bis(diethylamino)benzophenone, 4-acyloxy-4'-diethylaminobenzophenone. Derivatives of aryl ketones and p-dialkylaminoarylaldehydes as disclosed by Dueber U.S. Pat. No. 4,162,162 which is incorporated by reference. Particularly 2-[9'(2',3',7'-tetrahydro-1H,5H-benzo[ij]-quinolylidene)]-5,6-dimethoxy-1-indanone claimed in U.S. Pat. No. 4,162,162 is effective in this regard. N-alkylindolylidenes or N-alkylbenzothiazolylidene alkanones disclosed in U.S. Pat. No. 4,454,218 which is incorporated by reference, and constrained N-alkyl aryl ketones as disclosed by Anderson et al. U.S. Pat. No. 4,535,052 which is herein incorporated by reference. Also 2,3,6,7-Tetrahydro-1,1,7,7-tetramethyl-11-oxo-1H,5H,11H-(1)benzopyrano[5,7,8-ij]quinolizine-10-carboxylic acid ethyl ester is an effective sensitizer in the formulations employed herein. Photosensitive compositions employed contain approximately 0.01-1 wt % photosensitizer.

Hydrogen donors/oxygen scavengers critical to efficient photopolymerization and comprising formulations of this invention include those disclosed in the aforementioned U.S. Pat. No. 4,414,312 and references cited therein, which disclosure is hereby incorporated by reference. In particular 2-mercaptobenzthiazole, 2-mercaptobenzoxazole and 2-mercaptobenzimidazole are useful. Hydrogen donors/oxygen scavenger compounds comprise 0.01–10 wt % of the total photosensitive composition.

Polymerization inhibitors may be added to improve the storage stability of the formulation. Examples of such inhibitors include hydroquinone, N-nitrosodiphenyleneamine, and, 1,4,4-trimethyl-2,3-diazabicyclo(3.2.2)non-2-ene,2,3-dioxide as disclosed in U.S. Pat. No. 4,168,982. Phenyl pyrazilidinones, and tetramethyldiphenyl quinone as disclosed in U.S. Pat. No.

4,168,982, and mixtures thereof. The quantity of polymerization inhibitors, if added, is usually about 0.01–10 wt % of the total photosensitive composition.

An adhesion promoter may be added to the photosensitive composition of the invention to improve adhesion between the photopolymerizable resin and the substrate to which it is applied. Suitable adhesion promoters are the polyfunctional alkoxysilane compounds disclosed in Merriman and Goff U.S. Pat. No. 5,063,115. Adhesion promoter, when added, usually constitutes 0.01–10 wt % of the total photosensitive composition.

Blending selected components of each type described above is generally completed by stirring or rolling the mixtures to assure complete dissolution. The solution is then treated with the photoactive monomers as outlined next.

Formation of the Liquid Photoresist

The aminoacrylate or aminomethylacrylate ester, or in general the tertiary amine having the acrylic double bonds as earlier defined and synthesized, is added to the photosensitive component-polyamic acid composition in order to make the Photoresist of this invention. This introduces the photoactive crosslinking agent into the formulation by forming a salt with the polyamic acid carboxylate functions, which may be a quaternary ammonium salt. Polyamic acid neutralization by the aminoacrylate or aminomethylacrylate esters employed in this invention may represent 5–150 mol % of the theoretical available carboxylic acid functions present. Preferably 10–100 mol %, and more preferably 25–75 mol % neutralization affords good photospeed and processability with the aminoacrylate or aminomethylacrylate esters described by formulas (C), (D) and (E). More preferable formulas are (C) and (E). For performance purposes, it is convenient to compare cases, in which the ratio of double bonds to carboxyl groups is the same. Examples of photosensitive aminomethacrylates which may be used include N-methyldiethanolamine dimethacrylate, N-ethyldiethanolamine dimethacrylate, N-butyldiethanolamine dimethacrylate, N,N-dimethylamino-1-propyl-2,3-dimethacrylate, N,N-diethylamino-1-propyl-2,3-dimethacrylate, 2-N-morpholinoethylmethacrylate, and triethanolamine trimethacrylate. In particular N-methyldiethanolamine dimethacrylate (M1), 2-N-morpholinoethylmethacrylate (M8), and N-ethyldiethanolamine dimethacrylate (M4) produce formulations with improved processability.

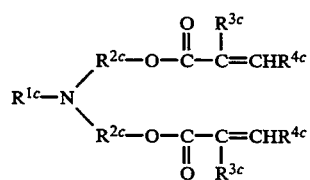

(C)

$R^{1c}$ is alkyl $C_1$-$C_6$, c-alkyl, vinyl, allyl
$R^{2c}$ is alkyl $C_1$-$C_{12}$, c-alkyl
$R^{3c}$ is H, alkyl $C_1$-$C_2$
$R^{4c}$ is H, aryl

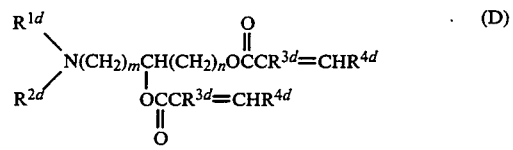

(D)

$R^{1d}$, $R^{2d}$ are independently alkyl $C_1$-$C_6$, c-alkyl, vinyl, allyl
$R^{3d}$ is H, alkyl $C_1$-$C_2$
$R^{4d}$ is H, aryl
m, n are independently integers 1–6

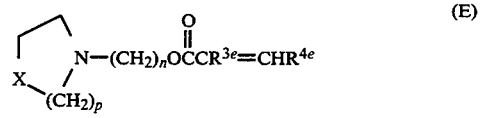

(E)

$R^{3e}$ is H, alkyl $C_1$-$C_2$
$R^{4e}$ is H, aryl
X=O, S
p is an integer 1,2
n is an integer 1–6.

The neutralized polyamic compositions are thoroughly blended, and then pressure filtered through 0.1–10 micron filters to the final photosensitive solutions or photoresists, which may be used for substrate coating and further processing.

Application and Processing of the Photoresist

The photosensitive compositions or photoresists prepared may generally be coated on silicon, ceramic or similar substrates. Adhesion promoters may be applied directly to the substrate surface before coating, or introduced as part of the coating formulation as previously described. An aminosilane compound, such as 3-aminopropyltriethoxysilane, is commonly used directly for this purpose. The photoresist is usually applied by spinning the wafer at 1000–6000 rpm for 30 seconds, then prebaking on a hot plate or in a convection oven to partially remove solvent and produce an approximate 2–50 micron thick film coating. The coated substrate is then exposed to an ultraviolet light source, which is passed through a mask template, using a contact or projection printer. Exposed wafers are subsequently developed by immersion or spraying with a solvent, then rinsed, which removes the unexposed regions of the coating, leaving behind an insoluble polymer relief structure which reproduces the original template. Developer solution can be a mixture of solvents including, but not limited to, N-methyl-2-pyrolidone, dimethylsulfoxide, N,N-dimethylformamide, N,N-diethylacetamide, γ-butyrolactone, ethylene glycol dimethyl ether, methanol, isopropanol and water. A mixture of N-methylpyrolidone, methanol and water (13/7/1 wt ratio) was employed for immersion development testing of the photoresists of this invention. A final water or isopropanol rinse was used before drying the wafer. Film retention may be measured by thickness and/or weight loss. Coating development rate may be established for the photoresist from this data. Image resolution may be established by optical and scanning electron microscopy of the pattern features. Table 2 provides a summary of photosensitive formulation or photoresist performance, listing development rate (micrometer/sec), % initial film thickness retained after 480 mJ/cm$^2$ exposure (providing a high excess of exposure) and development, smallest feature resolved (micrometers), and an efficiency factor defined as:

$$\text{Efficiency} = \frac{\text{(development rate)} \times \text{(\% film retention)}}{\text{(minimum feature size resolved)}}$$

This provides an estimate of the overall effectiveness of a given aminomethacrylate monomer formulation to produce a resolved image, within a development interval, with minimum exposed film loss. If no feature resolution was achieved a 0.0 efficiency was assigned to the formulation employed. Comparisons between various aminomethacrylate monomers should be made at comparable total acrylate levels, as listed in Table 2. Although the efficiency as defined above gives a good overall picture, it is important that each essential property of the photoresist stays within certain practical limits. The development rate should not be lower than 0.10, and preferably 0.12 micrometers per second. The % thickness retention at 480 mJ/cm$^2$ should not be lower than 70%, and preferably 80%. The minimum feature size in a 15±2 thick photoresist film micrometers should not be greater than 20, and preferably 15 micrometers.

Spray development of imaged coatings was also examined and Spray Development Rates expressed in mg/sec for specific aminomethacrylate monomer formulations was measured or estimated, and the results are summarized in Table 3.

Patterned wafers were program cured at 2° C./min to 150° C. for 30 minutes, to 300° C. for 30 minutes, and 400° C. for 60 minutes in a nitrogen purged convection oven. The curing procedure decomposes the acrylate crosslinkages, expels residual photosensitive components and yields a polyimide film with relief image permanently fixed on the substrate. The cured film exhibits good pattern resolution, chemical, thermal and mechanical properties. Process details are presented with the specific examples.

Photosensitive compositions or photoresists prepared as described according to the present invention are most useful when employed with rigid polyamic acids. Rigid polyamic acids are generally synthesized from linear diamines and linear dianhydrides and have minimal flexible linkages in the polymer chain, as explained by S. Numata and N. Kinjo Poly. Eng. and Sci., 28, 906 (1988). Polymers prepared from p-phenylenediamine and 3,3',4,4'-biphenyltetracarboxylic dianhydride or p-phenylene diamine and pyromellitic dianhydride are examples of rigid polyamic acid systems. Such polyamic acids tend to have limited solubility in the common aprotic solvents used for synthesis, which also limits the solubility of their salts, produced upon admixture with photosensitive aminoacrylate and aminomethacrylate esters. Thus, upon irradiation of a coated film prepared with rigid polyamic acid salts, solubility differences between the exposed crosslinked regions and the unexposed regions of the film are greatly diminished, which in turn reduces image contrast and resolution upon development. The desirable properties of the cured polyimide films obtained from many rigid polyamic acids have therefore frequently not been available in a directly photo-patternable composition with the dialkylaminoacrylate and dialkylaminomethacrylates generally employed, such as disclosed for example in U.S. Pat. No. 4,243,743, U.S. Pat. No. 4,565,767, and U.S. Pat. No. 4,741,988.

The photoresists of this invention introduce new substituted amine structures to the amino(meth)acrylate esters employed, which impart significant enhancement in the imaging and development of these formulations generally, and in particular with rigid polyamic acid containing formulations. The heretofore unrecognized advantage of incorporating these aminoacrylate and aminomethacrylate esters is demonstrated in the examples and summarized in Table 2.

Three photosensitive compositions i, ii, and iii were used in combination with three polyamic acids, the 3,3',4,4'-biphenyl tetracarboxylic dianhydride and paraphenylene diamine (BPDA/PPD) polymer, the pyromellitic dianhydride and 4,4'-diaminodiphenyl ether (PMDA/ODA) polymer, and the 3,3',4,4'-benzophenone tetracarboxylic dianhydride, meta-phenylene diamine, and 4,4'-diaminodiphenyl ether (BTDA/MPD/ODA) polymer. These polyamic acids represent rigid, semi-rigid and flexible polymer systems respectively, with corresponding differences in solvent solubility. The above ingredients were evaluated with the nine aminomethacrylate ester monomers designated M1-M9 in Table 1. N,N-dimethylaminoethylmethacrylate (M2) and N,N-diethylaminoethylmethacrylate (M3) are dialkyaminomethacrylate derivatives most commonly used in photosensitive polyamic acid quaternary salt compositions, as in U.S. Pat. No. 4,243,743, U.S. Pat. No. 4,565,767, and U.S. Pat. No. 4,741,988. The remaining monomers used represent new structures for promoting the imaging and development of rigid polyamic acids.

Each composition is grouped by the development efficiency value in Table 2. Examination of Composition i formulations with BPDA/PPD polyamic acid show the improved overall efficiency of N-methyldiethanolamine dimethacrylate (M1) monomer versus M2 in readily producing a resolved pattern.

Analysis of composition iii formulations, also with BPDA/PPD polyamic acid, demonstrate the processing advantages of M1 and 2-N-morpholinoethylmethacrylate (M8) monomers versus both M2 and M3. Furthermore, N-ethyldiethanolamine dimethacrylate (M4) also processes more effectively than either M2 or M3 at equivalent methacrylate level. This enhanced lithographic processing of the BPDA/PPD polyamic acid makes it possible to directly produce an image in the derived polyimide, and therefore effectively utilize the desirable thermal and mechanical properties of this polymer in electrical device construction.

Composition iii formulations prepared with the semi-rigid PMDA/ODA polyamic acid and monomer M1 also show enhanced image development rate, film retention and overall process efficiency, versus M2. This is significant to increased device manufacture throughput and yield.

Composition iii formulations which incorporate the flexible and more soluble BTDA/MPD/ODA polyamic acid containing the M1 monomer exhibit superior overall processing in contrast to the widely used M2 dialkylaminomethacrylate.

Photoresist Performance Measurements

Film Preparation

A 4 inch silicon wafer having a silicon dioxide layer is coated with the test formulation by conventional spin coating followed by prebaking in a convection oven at 55° C. for 120 minutes in order to produce a dry film of 15±2 micrometers in thickness. The spin-coater speed employed depends on the viscosity and other characteristics of the formulation. An initial speed of about 2500 rpm for 30 seconds is a good starting point. If the dry film thickness is found to be too high or too low, the speed to be used is increased or decreased respectively, until a dry film on a wafer falls within the desired range. A scratch on the wafer is made and the depth of the dry film to the wafer surface is determined with a Tencor Profilometer (Reston, Va.). This value ($d_0$) is used to establish the development rate and the percent film retention described below.

Film Exposure and Patterning

The dry film coated wafer is patterned on a Karl Suss Model MA 56W contact printer (Waterbury Center, Vt.), with 350 watt mercury broad band light source having a 12 mW/cm$^2$ intensity at 365 nm, for 67 seconds, using an Opto-line, model 4000-5 F.S. multidensity resolution mask (Andover, Mass.). The mask generates line and space features from 1 to 50 microns, having 1 to 60% of the total exposure energy used, on the negative photoresist coating.

Film Development Rate

The gradient patterned portion of the wafer (⅔ total) is cut out and developed by repeated immersion (60 dips/min) in a solution containing N-methylpyrrolidone, methanol, and water (13/7/1 wt ratio) for 10 to 600 seconds (t), followed by 15 sec isopropanol immersion rinse and air drying. The depth of the unexposed film regions ($d_t$) is measured by profilometer, and the development rate established ($d_t/t$) in microns/second.

% Thickness Retention at 480 mJ/cm$^2$

The gradient patterned portion of the wafer is immersion developed as described above until a minimum feature line can be resolved within 600 seconds or film loss prevents feature resolution. Film depth ($d_f$) of the 480 mJ/cm$^2$ section is established by scratch-profilometer measurement. The % film retention is established from the film depth and original film thickness ($d_0$) as ($d_f/d_0$)×100.

Minimum Feature Size

Optical microscope inspection of the developed pattern establishes the feature spaces (vias) which are clearly opened.

Spray Development Rate

A 4 inch silicon wafer with a silicon dioxide coating, which is pretreated with 3-aminopropyltriethoxysilane adhesion promoter, is coated with the photosensitive solution by spin coating at approximately 2000 rpm for 30 seconds. The wafer is prebaked on a hot plate at 90° C. for 6 minutes and at 60° C. for 6 minutes to remove solvent and provide a 20±2 micron thick film (~200 mg). The coated wafer is patterned on a Karl Suss Model MA 56W contact printer (Waterbury Center, Vt.), with 350 watt mercury broad band light source having a 12 mW/cm$^2$ intensity at 365 nm, for approximately 12 seconds, using an Opto-line, model 4000-5 F.S. multidensity resolution mask (Andover, Mass.). A 30 second, 60° C. post exposure bake follows.

Wafer spray development is performed on a Solitec negative developer track (Santa Clara, Calif.) with a N-methylpyrrolidone, methanol, dimethyl sulfoxide, water (13/7/2/1/ wt ratio) solution, followed by a water rinse and drying. Development rate (mg/sec) is determined from the coating weight and time to remove an unexposed wafer coating. Minimum feature resolution is determined by optical microscopy. Film retention is obtained versus exposure dose by film thickness measurements with a profilometer compared to the original undeveloped film thickness.

Although during the discussion of this invention an attempt has been made to provide explanations of the different phenomena occurring, it should be understood that such explanations are only speculative and they should not be construed as restricting this invention in any way.

GLOSSARY

BPDA: 3,3',4,4'-biphenyltetracarboxylic dianhydride
BTDA: 3,3',4,4'-benzophenone tetracarboxylic dianhydride
MPD: meta-phenylene diamine
ODA: 4,4'-diaminodiphenyl ether
PPD: para-phenylene diamine

EXAMPLES

The following Examples are given for illustration purposes. All parts and percentages are by weight, unless otherwise specified.

|  | Grams |
|---|---|
| Composition i Ingredients |  |
| 1,4,4-Trimethyl-2,3-diazabicyclo(3.2.2)non-2-ene, 2,3-dioxide | 0.008 |
| 2-Mercaptobenzoxazole | 0.100 |
| Bis(2-o-chlorophenyl-4,5-diphenyl)imidazole | 0.300 |
| 4,4'-(Diethylamino)benzophenone | 0.151 |
| Total | 0.559 |
| Composition ii Ingredients |  |
| 1,4,4-Trimethyl-2,3-diazabicyclo(3.2.2)non-2-ene, 2,3-dioxide | 0.090 |
| 2-Mercaptobenzoxazole | 1.180 |
| Bis(2-o-chlorophenyl-4,5-diphenyl)imidazole | 3.590 |
| 2-[9'(2',3',7'-tetrahydro-1H,5H-benzo[ij]-quinolylidene)]-5,6-dimethoxy-1-indanone | 0.230 |
| Total | 5.090 |
| Composition iii Ingredients |  |
| 1,4,4-Trimethyl-2,3-diazabicyclo(3.2.2)non-2-ene, 2,3-dioxide | 0.088 |
| 2-Mercaptobenzoxazole | 1.182 |
| Bis(2-o-chlorophenyl-4,5-diphenyl)imidazole | 3.590 |
| 2,3,6,7-Tetrahydro-1,1,7,7-tetramethyl-11-oxo-1H,5H,11H-(l)benzopyrano[5,7,8-ij]quinolizine-10-carboxylic acid ethyl ester | 0.233 |
| Total | 5.093 |

EXAMPLE 1A

The aminoacrylates described were prepared from the corresponding alkylaminoalcohols as detailed for N-methyldiethanolamine dimethacrylate. N-Methyldiethanolamine (357 g), 800 ml toluene, phenothiazine (3 g), and methacrylic acid (645 g) were added to a 3 liter reaction flask, fitted with stirrer, heating mantle, condenser and Dean-Stark trap. Methanesulfonic acid (432 g) was added and the reaction heated to reflux. The theoretical water of reaction was collected azeotropically and the solution was then cooled to 15° C. The mixture was neutralized with 25 wt % aqueous sodium hydroxide and the organic phase collected, washed with 10% brine solution, then dried over anhydrous magnesium sulfate. The solution was treated with decolorizing carbon, filtered, then passed over 300 g activated, basic alumina (Brockman activity I). Phenothiazine (0.1 g) was added and the solvent removed under reduced pressure (1 torr) to 680 g N-methyldiethanolamine dimethacrylate (89% yield), which was 99.6% pure by gas chromatographic analysis. Chemical structure was confirmed by nuclear magnetic resonance and infrared spectroscopy. This method provides high yields of heat sensitive or high boiling aminoacrylates without vacuum distillation, Table 1.

The same procedure, but using vacuum distillation, with phenothiazine added, for isolation afforded N-methyldiethanolamine dimethacrylate (85° C./0.1 torr), in 71% yield and 97% purity. Significant residual tar remained in the distillation vessel.

EXAMPLE 1B

Example 1A was repeated using triethanolamine (59.6 g), phenothiazine (1 g), methacrylic acid (206 g), and methanesulfonic acid (57 g) in 200 ml p-xylene. Isolation by chromatography over basic alumina gave 120 g (85% yield) of triethanolamine trimethacrylate, which was 99.0% pure.

Isolation by vacuum distillation (153°–163° C./0.5 torr) produced the triethanolamine trimethacrylate in 17% yield, with significant loss to tars in the distillation flask.

EXAMPLE 2

Composition iii (5.093 g) was added to a 300 g solution (13.4 wt %) of the polyamic acid prepared from 3,3',4,4'-biphenyl tetracarboxylic dianhydride and para-phenylene diamine (BPDA/PPD, Dupont PI2611) in N-methylpyrrolidone and blended for 12 hours. N-methyldiethanolamine dimethacrylate (12.750 g) was added and the solution rolled 12 hours, then filtered to give a photosensitive solution. A 4 inch silicon wafer having a silicon dioxide coating, was coated with the photosensitive solution by spin coating at approximately 2500 rpm for 30 seconds. The wafer was pre-baked at 55° C. for 120 minutes to remove solvent and provide a 16 micron thick film. The coated wafer was patterned on a Karl Suss Model MA 56W contact printer (Waterbury Center, Vt.), with 350 watt mercury broad band light source having a 12 mW/cm$^2$ intensity at 365 nm, for 67 seconds, using an Opto-line, model 4000-5 F.S. multidensity resolution mask (Andover, Mass.).

Wafer development was performed by repeated immersion (60 dips/min) in a solution containing N-methylpyrrolidone, methanol, and water (13/7/1 wt ratio), followed by an isopropanol rinse and drying. Development rate was established by film thickness measurement with a Tencor profilometer (Reston Va.). Pattern resolution was determined by optical microscopy. Film thickness retention was obtained versus exposure dose with a profilometer. The formulation gave a 0.12 $\mu$M/sec development rate, 88.4% film retention, 8 $\mu$M feature resolution and a 1.33 efficiency value, Table 2.

Coated wafers were program cured at 2° C./min to 150° C. for 30 minutes, to 300° C. for 30 minutes, and 400° C. for 60 minutes in a nitrogen purged convection oven which afforded an 8 micron thick polyimide film. The cured film exhibited good pattern resolution, thermal and mechanical properties.

EXAMPLE 3

Composition iii (5.093 g) was added to a 300 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N-methyldiethanolamine dimethacrylate (25.500 g) was added, mixed and filtered. The photosensitive solution was coated on a silicon wafer, imaged, developed and the development rate, resolution and film retention measured as described in Example 2. The formulation gave a 0.16 $\mu$M/sec development rate, 92.0% film retention, 15 $\mu$M feature resolution and a 0.98 efficiency value, Table 2.

EXAMPLE 4

Composition iii (5.093 g) was added to a 300 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N,N-Dimethylaminoethylmethacrylate (7.860 g) was added, mixed and filtered. The photosensitive solution was coated on a silicon wafer, imaged, developed and the development rate, resolution and film retention measured as described in Example 2. The formulation gave a <0.10 $\mu$M/sec development rate, no film retention and no feature resolution at this monomer level, Table 2.

EXAMPLE 5

Example 4 was repeated using 15.720 g N,N-dimethylaminoethylmethacrylate. The formulation gave a 0.05 $\mu$M/sec development rate, 42.7% film retention and no feature resolution at this monomer level, in strong contrast to Example 2, Table 2.

EXAMPLE 6

Example 4 was repeated using 31.440 g N,N-dimethylaminoethylmethacrylate. The formulation gave a 0.06 $\mu$M/sec development rate, 55.4% film retention, 25 $\mu$M feature resolution and a 0.13 efficiency value, Table 2.

EXAMPLE 7

Composition i (0.559 g) was added to a 36.00 g solution (13.9 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N-methyldiethanolamine dimethacrylate (3.196 g) was added, mixed and filtered. The photosensitive solution was coated on a silicon wafer, imaged, developed and the development rate, resolution and film retention measured as described in Example 2. The formulation gave a 0.26 $\mu$M/sec development rate, 100% film retention, 80 $\mu$M feature resolution and a 0.33 efficiency value, Table 2.

EXAMPLE 8

Example 7 was repeated using 6.333 g N-methyldiethanolamine dimethacrylate. The formulation gave a 0.43 $\mu$M/sec development rate, 100% film retention, 80 $\mu$M feature resolution and a 0.54 efficiency value, Table 2.

EXAMPLE 9

Composition i (0.559 g) was added to a 36.00 g solution (13.9 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N,N-Dimethylaminoethylmethacrylate (3.926 g) was added, mixed and filtered. The photosensitive solution was coated on a silicon wafer, imaged, developed and the development rate, resolution and film retention measured as described in Example 2. The formulation gave a 0.02 μM/sec development rate, 100% film retention and no feature resolution, Table 2, in contrast to Example 7.

EXAMPLE 10

Example 2 was repeated using 18.500 g N,N-diethylaminoethylmethacrylate as the amine source. The formulation gave a 0.08 μM/sec development rate, 86.7% film retention, 30 μM feature resolution and a 0.23 efficiency value, Table 2, in contrast to Example 2.

EXAMPLE 11

Composition iii (8.484 g) was added to a 500 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N-ethyldiethanolamine dimethacrylate (22.420 g) was added and the solution mixed, then filtered to give a photosensitive solution. A silicon wafer was coated with the formulation, processed and analyzed as described in Example 2. The formulation gave a 0.09 μM/sec development rate, 88.5% film retention, 20 μM feature resolution and a 0.40 efficiency value, Table 2.

EXAMPLE 12

Composition iii (8.484 g) was added to a 500 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N-butyldiethanolamine dimethacrylate (24.760 g) was added and the solution mixed, then filtered to give a photosensitive solution. A silicon wafer was coated with the formulation, processed and analyzed as described in Example 2. The formulation gave a 0.13 μM/sec development rate and 54.3% film retention, Table 2.

EXAMPLE 13

Composition iii (8.484 g) was added to a 500 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N,N-dimethylamino-1-propyl-2,3-dimethacrylate (21.260 g) was added and the solution mixed, then filtered to give a photosensitive solution. A silicon wafer was coated with the formulation, processed and analyzed as described in Example 2. The formulation gave a 0.08 μM/sec development rate with 79.3% film retention, Table 2.

EXAMPLE 14

Composition iii (8.484 g) was added to a 500 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. N,N-diethylamino-1-propyl-2,3-dimethacrylate (23.590 g) was added and the solution blended, then filtered to give a photosensitive solution. A silicon wafer was coated with the formulation, processed and analyzed as described in Example 2. The formulation gave a 0.10 μM/sec development rate, 72.1% film retention, 50 μM feature resolution and a 0.14 efficiency value, Table 2.

EXAMPLE 15

Composition iii (4.165 g) was added to a 245.5 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. 2-N-Morpholinoethylmethacrylate (16.310 g) was added and the solution blended, then filtered to give a photosensitive solution. A silicon wafer was coated with the formulation, processed and analyzed as described in Example 2. The formulation gave a 0.12 μM/sec development rate, 87.3% film retention, 12 μM feature resolution and a 0.87 efficiency value, Table 2.

EXAMPLE 16

Composition iii (9.122 g) was added to a 300 g solution (24.0 wt %) of the polyamic acid prepared from 3,3',4,4'-benzophenone tetracarboxylic dianhydride, meta-phenylene diamine, and 4,4'-diaminobiphenyl ether in N-methylpyrrolidone (BTDA/MPD/ODA, Dupont PI2525) and blended. N-methyldiethanolamine dimethacrylate (19.295 g) was added, mixed and filtered. The photosensitive solution was coated on a silicon wafer, imaged, developed and the development rate, resolution and film retention measured as described in Example 2. The formulation gave a 0.30 μM/sec development rate and an 80.5% film retention, Table 2.

EXAMPLE 17

Example 16 was repeated with 38.590 g N-methyldiethanolamine dimethacrylate. The formulation gave a 0.37 μM/sec development rate, 93.8% film retention, 12 μM feature resolution and a 2.89 efficiency value, Table 2.

EXAMPLE 18

Composition iii (9.122 g) was added to a 300 g solution (24.0 wt %) of the polyamic acid prepared from 3,3',4,4'-benzophenone tetracarboxylic dianhydride, meta-phenylene diamine, and 4,4'-diaminodiphenyl ether in N-methylpyrrolidone (BTDA/MPD/ODA, Dupont PI2525) and blended. N,N-Dimethylaminoethylmethacrylate (11.882 g) was added, mixed and filtered. The photosensitive solution was coated on a silicon wafer, imaged, developed and the development rate, resolution and film retention measured as described in Example 2. The formulation gave a 0.24 μM/sec development rate, 90.1% film retention, 50 μM feature resolution and a 0.43 efficiency value, Table 2.

EXAMPLE 19

Example 18 was repeated using 23.764 g N,N-dimethylaminoethylmethacrylate. The formulation gave a <0.24 μM/sec development rate, 90.8% film retention but no feature resolution in contrast to Example 16, Table 2.

EXAMPLE 20

Example 18 was repeated using 47.528 g N,N-dimethylaminoethylmethacrylate. The formulation gave a <0.24 μM/sec development rate, 100% film retention but no feature resolution in contrast to Example 17, Table 2.

EXAMPLE 21

Composition iii (5.890 g) was added to a 300 g solution (15.5 wt %) of the polyamic acid prepared from pyromellitic dianhydride and 4,4'-diaminodiphenyl ether in N-methylpyrrolidone (PMDA/ODA, Dupont PI2542) and blended. N-methyldiethanolamine dimethacrylate (14.190 g) was added, mixed and filtered. The photosensitive solution was coated on a silicon wafer, imaged, developed and the development rate, resolution and film retention measured as described in Example 2. The formulation gave a 0.24 $\mu$M/sec development rate, 70.6% film retention, 6 $\mu$M feature resolution and a 2.82 efficiency value, Table 2.

EXAMPLE 22

Example 21 was repeated with 28.380 g N-methyldiethanolamine dimethacrylate. The formulation gave a 0.24 $\mu$M/sec development rate, 79.5% film retention, 10 $\mu$M feature resolution and a 1.91 efficiency value, Table 2.

EXAMPLE 23

Composition iii (5.890 g) was added to a 300 g solution (15.5 wt %) of the polyamic acid prepared from pyromellitic dianhydride and 4,4'-diaminodiphenyl ether in N-methylpyrrolidone (PMDA/ODA, Dupont PI2542) and blended. N,N-Dimethylaminoethylmethacrylate (8.730 g) was added, mixed and filtered. The photosensitive solution was coated on a silicon wafer, imaged, developed and the development rate, resolution and film retention measured as described in Example 2. The formulation gave a 0.16 $\mu$M/sec development rate, 55.8% film retention, 5 $\mu$M feature resolution and a 1.79 efficiency value, Table 2.

EXAMPLE 24

Example 23 was repeated with 17.460 g N,N-dimethylaminoethylmethacrylate. The formulation gave a 0.16 $\mu$M/sec development rate, 78.2% film retention but no feature resolution in contrast to Example 21, Table 2.

EXAMPLE 25

Example 23 was repeated with 34.920 g N,N-dimethylaminoethylmethacrylate. The formulation gave a 0.16 $\mu$M/sec development rate, 79.0% film retention but no feature resolution in contrast to Example 22, Table 2.

EXAMPLE 26

Composition iii (5.093 g) was added to a 300 g solution (13.4 wt %) of the polyamic acid prepared from 3,3',4,4'-biphenyl tetracarboxylic dianhydride and para-phenylene diamine (BPDA/PPD, Dupont PI2611) in N-methylpyrrolidone and blended. N,N Diethylamino-ethylmethacrylate (9.250 g) was added, mixed and filtered. The photosensitive solution was coated on a silicon wafer, imaged, developed and the development rate, resolution and film retention measured as described in Example 2. The formulation gave a 0.08 $\mu$M/sec development rate, 53.7% film retention, 10 $\mu$M feature resolution and a 0.43 efficiency value, Table 2.

EXAMPLE 27

Composition iii (8.479 g) was added to a 500 g solution (13.4 wt %) of the polyamic acid prepared from 3,3',4,4'-biphenyl tetracarboxylic dianhydride and para-phenylene diamine in N-methylpyrrolidone (BPDA/PPD, Dupont PI2611) and blended. Triethanolamine trimethacrylate (29.420 g) was added, mixed and filtered. The photosensitive solution was coated on a silicon wafer, imaged, and developed as described in Example 2. No differentiation between exposed and unexposed film was observed over a range of development periods, Table 2.

EXAMPLE 28

Example 26 was repeated using 37.000 g N,N-diethylamino-ethylmethacrylate. The formulation gave a 0.09 $\mu$M/sec development rate, 88.5% film retention, 20 $\mu$M feature resolution and a 0.40 efficiency value compared with Example 3, Table 2.

EXAMPLE 29

Composition ii (5.090 g) was added to a 300 g solution (13.4 wt %) of the polyamic acid prepared from 3,3',4,4'-biphenyl tetracarboxylic dianhydride and para-phenylene diamine (BPDA/PPD, Dupont PI2611) in N-methylpyrrolidone and blended. N-methyldiethanolamine dimethacrylate ( 12.760 g) was added, mixed and filtered. The photosensitive solution was coated on a silicon wafer, imaged, developed and the development rate, resolution and film retention measured as described in Example 2. The formulation gave a 0.11 $\mu$M/sec development rate, 93.4% film retention, 15 $\mu$M feature resolution and a 0.68 efficiency value, Table 2.

EXAMPLE 30

Composition iii (5.093 g) was added to a 300 g solution (13.4 wt %) of the polyamic acid prepared from 3,3',4,4'-biphenyl tetracarboxylic dianhydride and para-phenylene diamine (BPDA/PPD, PI2611) in N-methylpyrrolidone, and blended for 12 hours. N-methyldiethanolamine dimethacrylate (12.750 g) was added and the solution rolled 12 hours, then filtered to give a photosensitive solution. A 4 inch silicon wafer with a silicon dioxide coating, which was pretreated with 3-aminopropyltriethoxysilane adhesion promoter, was coated with the photosensitive solution by spin coating at approximately 2000 rpm for 30 seconds. The wafer was prebaked on a hot plate at 90° C. for 6 minutes and at 60° C. for 6 minutes to remove solvent and provide a 20 micron thick film (~200 mg). The coated wafer was patterned on a Karl Suss Model MA 56W contact printer (Waterbury Center Vt.), with 350 watt mercury broad band light source having a 12 mW/cm$^2$ intensity at 365 nm, for approximately 12 seconds, using an Opto-line, model 4000-5 F.S. multidensity resolution mask (Andover, Mass.). A 30 second, 60° C. post exposure bake followed.

Wafer spray development was performed on a Solitec negative developer track (Santa Clara, Calif.) with a N-methylpyrrolidone, methanol, dimethyl sulfoxide, water (13/7/2/1/ wt ratio) solution, followed by a water rinse and drying. Development rate was established by film weight measurement. Pattern resolution was determined by optical microscopy. Film retention was obtained versus exposure dose with a profilometer. The coating prepared with the N-methyldiethanolamine dimethacrylate monomer was completely developed at a 0.85 mg/sec rate, Table 3.

EXAMPLES 31-33

Example 30 was repeated except 7.805, 15.609, and 31.219 grams of N,N-dimethylaminoethylmethacrylate respectively, were employed as the photosensitive amine. Spray development of these formulations afforded 0.38, 0.31, and <0.19 mg/sec development rates respectively, all considerably slower than Example 30 and impractical for use, Table 3.

EXAMPLES 34-36

Example 30 was repeated using 9.255, 18.511 and 37.022 grams of N,N-diethylaminoethylmethacrylate respectively as the photosensitive amine. Spray development of these formulations produced <0.24, <0.18, and <0.13 mg/sec development rates respectively, which were impractical versus Example 30, Table 3. No pattern development was observed under these conditions.

EXAMPLE MONOMER STRUCTURES

M1

$$CH_3-N\begin{array}{l}CH_2CH_2OC(O)-C(CH_3)=CH_2\\CH_2CH_2OC(O)-C(CH_3)=CH_2\end{array}$$

M2

$$\begin{array}{l}CH_3\\CH_3\end{array}\!\!\!>\!\!N-CH_2CH_2OC(O)-C(CH_3)=CH_2$$

M3

$$\begin{array}{l}CH_3CH_2\\CH_3CH_2\end{array}\!\!\!>\!\!N-CH_2CH_2OC(O)-C(CH_3)=CH_2$$

M4

$$CH_3CH_2-N\begin{array}{l}CH_2CH_2OC(O)-C(CH_3)=CH_2\\CH_2CH_2OC(O)-C(CH_3)=CH_2\end{array}$$

-continued
EXAMPLE MONOMER STRUCTURES

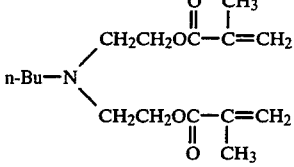

M5

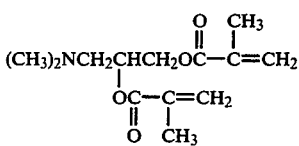

M6

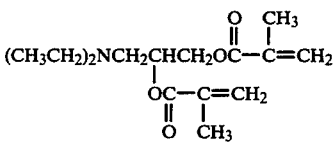

M7

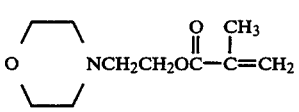

M8

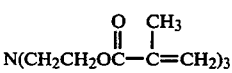

M9

$$N(CH_2CH_2OC(O)-C(CH_3)=CH_2)_3$$

TABLE 1

Monomer Reference and Synthesis Yields

| Abbreviation | Monomer | % Yield | % Purity |
|---|---|---|---|
| M1 | N-methyldiethanolamine dimethacrylate | 89 | 99.6 |
| M2 | N,N-dimethylaminoethylmethacrylate* | — | — |
| M3 | N,N-diethylaminoethylmethacrylate* | — | — |
| M4 | N-ethyldiethanolamine dimethacrylate | 89 | 99.1 |
| M5 | N-butyldiethanolamine dimethacrylate | 78 | 98.8 |
| M6 | N,N-dimethylamino-1-propyl-2,3-dimethacrylate | 86 | 98.0 |
| M7 | N,N-diethylamino-1-propyl-2,3-dimethacrylate | 90 | 98.8 |
| M8 | 2-N-morpholinoethylmethacrylate | 90 | 99.9 |
| M9 | triethanolamine trimethacrylate | 85 | 99.0 |

*Polysciences Inc. (Warrington, PA)

TABLE 2

Monomer Effect on Dip Development Rate and Resolution

| Example | Resin | Comp | Monomer (Table 1) | Develop Rate (uM/sec) | % Ret @ 480 mJ/cm2 | Min Feature Size in 15 uM Film (uM) | Efficiency DR × % Ret/ Min Feat. | (Mols Acrylate) × 100/ (Mols COOH) |
|---|---|---|---|---|---|---|---|---|
| 8 | BPDA/PPD | i | M1 | 0.43 | 100 | 80 | 0.54 | 200 |
| 7 | BPDA/PPD | i | M1 | 0.26 | 100 | 80 | 0.33 | 100 |
| 9 | BPDA/PPD | i | M2 | 0.02 | 100 | ∞ | 0.00 | 100 |
| 29 | SPDA/PPD | ii | M1 | 0.11 | 93.4 | 15 | 0.68 | 50 |
| 12 | BPDA/PPD | iii | M5 | 0.13 | 54.3 | — | — | 50 |
| 13 | BPDA/PPD | Iii | M6 | 0.08 | 79.3 | — | — | 50 |
| 2 | BPDA/PPD | iii | M1 | 0.12 | 88.4 | 8 | 1.33 | 50 |
| 3 | BPDA/PPD | iii | M1 | 0.16 | 92.0 | 15 | 0.98 | 100 |
| 15 | SPDA/PPD | iii | M8 | 0.12 | 87.3 | 12 | 0.87 | 50 |
| 26 | BPDA/PPD | iii | M3 | 0.08 | 53.7 | 10 | 0.43 | 25 |
| 11 | BPDAlPPD | iii | M4 | 0.09 | 88.5 | 20 | 0.40 | 50 |
| 28 | BPDA/PPD | iii | M3 | 0.09 | 88.5 | 20 | 0.40 | 100 |
| 10 | SPDA/PPD | iii | M3 | 0.08 | 86.7 | 30 | 0.23 | 50 |
| 14 | BPDA/PPD | iii | M7 | 0.10 | 72.1 | 50 | 0.14 | 50 |
| 6 | BPDA/PPD | iii | M2 | 0.06 | 55.4 | 25 | 0.13 | 100 |
| 4 | DPOA/PPD | iii | M2 | <0.10 | 0.0 | ∞ | 0.00 | 25 |
| 5 | BPOA/PPD | iii | M2 | 0.05 | 42.7 | ∞ | 0.00 | 50 |
| 27 | BPDA/PPD | iii | M9 | — | <10 | ∞ | 0.00 | 75 |
| 16 | BTDA/MPD/ODA | iii | M1 | 0.30 | 80.5 | — | — | 50 |

TABLE 2-continued

Monomer Effect on Dip Development Rate and Resolution

| Example | Resin | Comp | Monomer (Table 1) | Develop Rate (uM/sec) | % Ret @ 480 mJ/cm2 | Min Feature Size in 15 uM Film (uM) | Efficiency DR × % Ret/ Min Feat. | (Mols Acrylate) × 100/ (Mols COOH) |
|---|---|---|---|---|---|---|---|---|
| 17 | BTDA/MPD/ODA | iii | M1 | 0.37 | 93.8 | 12 | 2.89 | 100 |
| 18 | BTDA/MPD/ODA | iii | M2 | 0.24 | 90.1 | 50 | 0.43 | 25 |
| 19 | BTDA/MPD/ODA | iii | M2 | <0.24 | 90.8 | ∞ | 0.00 | 50 |
| 20 | BTDA/MPD/ODA | iii | M2 | <0.24 | 100 | ∞ | 0.00 | 100 |
| 21 | PMDA/ODA | iii | M1 | 0.24 | 70.6 | 6 | 2.82 | 50 |
| 22 | PMDA/ODA | iii | M1 | 0.24 | 79.5 | 10 | 1.91 | 100 |
| 23 | PMDA/ODA | iii | M2 | 0.16 | 55.8 | 5 | 1.79 | 25 |
| 24 | PMDA/ODA | iii | M2 | 0.16 | 78.2 | ∞ | 0.00 | 50 |
| 25 | PMDA/ODA | iii | M2 | 0.16 | 79.0 | ∞ | 0.00 | 100 |

TABLE 3

Monomer Effect on Spray Development Rates

| Example | Monomer (Table 1) | Develop Rate (mg/sec) |
|---|---|---|
| 30 | M1 | 0.85 |
| 31 | M2 | 0.38 |
| 32 | M2 | 0.31 |
| 33 | M2 | <0.19 |
| 34 | M3 | <0.24 |
| 35 | M3 | <0.18 |
| 36 | M3 | <0.13 |

What is claimed is:

1. A negative photoresist comprising:
 (a) an aprotic N-methyl-2-pyrrolidone solvent;
 (b) a photosensitizing ingredient; and
 (c) a reaction product of (i) a polyamic acid derived from 3,3',4,4'-biphenyltetracarboxylic dianhydride and paraphenylene diamine and (ii) an N-methyldiethanolamine dimethacrylate tertiary amine, wherein the tertiary amine introduces from 10 to 200 ethylenic bonds per 100 carboxylic groups of the polyamic acid, with the proviso that a 13 to 17 micrometers thick film of the negative photoresist prepared by coating a silicon wafer with the photoresist composition, prebaking at 55° C. for 120 minutes, patternwise exposing the coated wafer to actinic radiation and developing the patterned wafer to remove unexposed areas of the coating by immersion in a solution of N-methylpyrrolidone, methanol and water (13/7/1 weight ratio) for from 10 to 600 seconds, followed by a 15 second isopropanol rinse and air drying has the following properties:
  (i) an immersion development rate of at least 0.10 micrometers per second;
  (ii) a thickness retention of at least 70% after exposure at a dosage of 480 mJ/cm², and
  (iii) a minimum pattern feature size of at most 20 micrometers.

2. A negative photoresist comprising:
 (a) an aprotic solvent;
 (b) a photosensitizing ingredient; and
 (c) a reaction product of a poly(amic acid) and a tertiary amine at least partially neutralizing the poly(amic acid), the tertiary amine having the formula

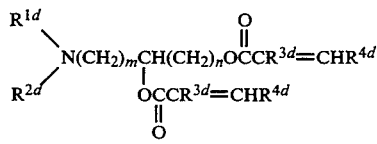

wherein:
 $R^{1d}$ and $R^{2d}$ are independently alkyl containing 1 to 6 carbon atoms or cycloalkyl containing 3 to 6 carbon atoms;
 $R^{3d}$ is independently H or alkyl containing 1 or 2 carbon atoms;
 $R^{4d}$ is independently H or aryl; and
 m and n are independently integers of 1 to 6;
 wherein the tertiary amine introduces from 10 to 200 ethylenic bonds per 100 carboxylic groups of the poly(amic acid), with the proviso that a 13 to 17 micrometers thick film of the negative photoresist prepared by coating a silicon wafer with the photoresist composition, prebaking at 55° C. for 120 minutes, patternwise exposing the coated wafer to actinic radiation and developing the patterned wafer to remove unexposed areas of the coating by immersion in a solution of N-methylpyrrolidone, methanol and water (13/7/1 weight ratio) for from 10 to 600 seconds, followed by a 15 second isopropanol rinse and air drying has the following properties:
  (i) an immersion development rate of at least 0.10 micrometers per second;
  (ii) a thickness retention of at least 70% after exposure at a dosage of 480 mJ/cm²; and
  (iii) a minimum pattern feature size of at most 20 micrometers.

* * * * *